(12) United States Patent
Farkas et al.

(10) Patent No.: US 9,350,098 B2
(45) Date of Patent: May 24, 2016

(54) SYSTEMS AND METHODS FOR STACKING COMPRESSION CONNECTORS

(71) Applicant: Dell Products L.P., Round Rock, TX (US)

(72) Inventors: Sandor Farkas, Round Rock, TX (US); Corey Dean Hartman, Hutto, TX (US); Brandon Joel Brocklesby, Pflugerville, TX (US); Joseph Tarantolo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 30 days.

(21) Appl. No.: 14/467,807

(22) Filed: Aug. 25, 2014

(65) Prior Publication Data

US 2016/0056560 A1  Feb. 25, 2016

(51) Int. Cl.
*H01R 12/00* (2006.01)
*H05K 1/00* (2006.01)
*H01R 12/71* (2011.01)
*H01R 12/70* (2011.01)
*H01R 43/00* (2006.01)

(52) U.S. Cl.
CPC .......... *H01R 12/716* (2013.01); *H01R 12/7011* (2013.01); *H01R 43/00* (2013.01)

(58) Field of Classification Search
CPC ... H01R 12/716; H01R 43/00; H01R 12/7011
USPC .......................................................... 439/66
See application file for complete search history.

(56) References Cited

U.S. PATENT DOCUMENTS

2007/0249232 A1\* 10/2007 Haneishi ................... 439/630

\* cited by examiner

*Primary Examiner* — Javaid Nasri
(74) *Attorney, Agent, or Firm* — Jackson Walker L.L.P.

(57) ABSTRACT

In accordance with embodiments of the present disclosure, a circuit board comprising may include a substrate, a primary compression connector, and a second compression connector. The substrate may have a first side and a second side and may have formed therein a substrate retention channel. The primary compression connector may be coupled to the first side and have formed thereon a primary connector retention channel aligned with the substrate retention channel. The second compression connector may be coupled to the second side opposite from the first compression connector and may have formed thereon a secondary connector retention channel aligned with the substrate retention channel and the primary connector retention channel to define a circuit board retention channel.

13 Claims, 17 Drawing Sheets

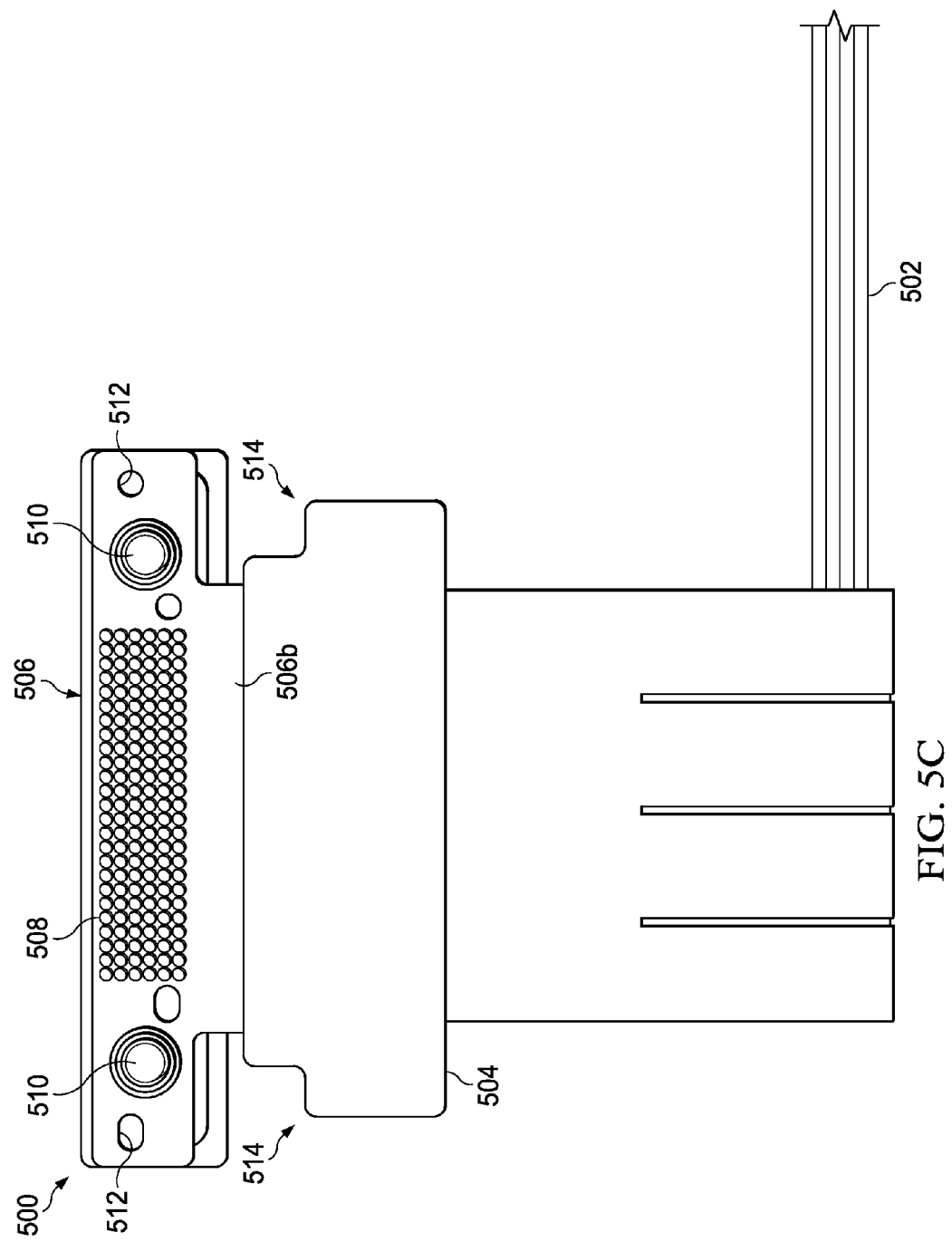

SYSTEMS AND METHODS FOR STACKING COMPRESSION CONNECTORS

TECHNICAL FIELD

The present disclosure relates in general to information handling systems, and more particularly to systems and methods for stacking compression connectors for use in electronic systems, including information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In an information handling system, various connectors are often used to electrically couple the various components of the information handling system to one another. In some instances, a component, such as a mezzanine or peripheral card, may utilize two connectors. For example, a mezzanine card may have one connector for coupling to a motherboard and another connector for coupling to another component. The presence of two different connectors may require two different keepout locations on the mezzanine card and two sets of mechanical retention hardware, which limits density of signal routing on such mezzanine card.

SUMMARY

In accordance with the teachings of the present disclosure, the disadvantages and problems associated with having multiple connectors on an information handling resource may be reduced or eliminated.

In accordance with embodiments of the present disclosure, a circuit board comprising may include a substrate, a primary compression connector, and a second compression connector. The substrate may have a first side and a second side and may have formed therein a substrate retention channel. The primary compression connector may be coupled to the first side and have formed thereon a primary connector retention channel aligned with the substrate retention channel. The second compression connector may be coupled to the second side opposite from the first compression connector and may have formed thereon a secondary connector retention channel aligned with the substrate retention channel and the primary connector retention channel to define a circuit board retention channel.

In accordance with these and other embodiments of the present disclosure, a system may include a first component, a second component, a third component, and a retention elements. The first component may have a first component connector and a first component retention channel. The second component may include a substrate having a first side and a second side and having formed therein a substrate retention channel, a primary compression connector coupled to the first side having formed thereon a primary connector retention channel aligned with the substrate retention channel, and a second compression connector coupled to the second side opposite from the first compression connector and having formed thereon a secondary connector retention channel aligned with the substrate retention channel and the primary connector retention channel to define a second component retention channel aligned with the first component retention channel. The third component may have a third component connector and a third component retention channel aligned with the first component retention channel and the second component retention channel. The retention element may be configured to be received in the first component retention channel, the second component retention channel, and the third component retention channel, and further configured to mechanically couple the first component, the second component, and the third component to one another, electrically couple the primary compression connector to the first component connector, electrically couple the second compression connector to the third component connector.

In accordance with these and other embodiments of the present disclosure, a method for coupling information handling resources may include providing a first component having a first component connector and a first component retention channel. The method may also include providing a second component comprising a substrate having a first side and a second side and having formed therein a substrate retention channel, a primary compression connector coupled to the first side having formed thereon a primary connector retention channel aligned with the substrate retention channel, and a second compression connector coupled to the second side opposite from the first compression connector and having formed thereon a secondary connector retention channel aligned with the substrate retention channel and the primary connector retention channel to define a second component retention channel aligned with the first component retention channel. The method may further include providing a third component having a third component connector and a third component retention channel aligned with the first component retention channel and the second component retention channel. The method may additionally include coupling a retention element within the first component retention channel, the second component retention channel, and the third component retention channel configured to mechanically couple the first component, the second component, and the third component to one another, electrically couple the primary compression connector to the first component connector, and electrically couple the second compression connector to the third component connector.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 5C illustrates a plan view of a second side of the example component of FIG. 5A, in accordance with embodiments of the present disclosure;

DETAILED DESCRIPTION

Figure 1:
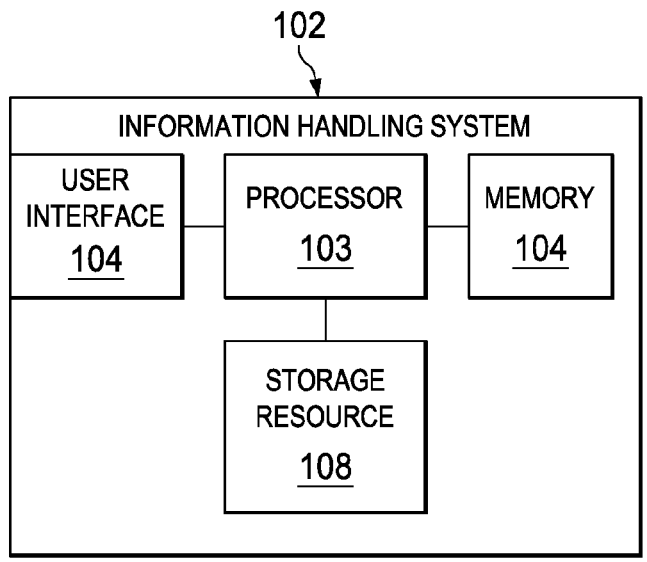
FIG. 1 illustrates a block diagram of selected components of an example information handling system, in accordance with embodiments of the present disclosure.

Preferred embodiments and their advantages are best understood by reference to FIGS. 1 through 10, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a functional block diagram of selected components of an example information handling system 102, in accordance with embodiments of the present disclosure. In some embodiments, information handling system 102 may be a personal computer (e.g., a desktop computer or a portable computer). In other embodiments, information handling system 102 may comprise a storage server for archiving data.

As depicted in FIG. 1, information handling system 102 may include a processor 103, a memory 104 communicatively coupled to processor 103, a storage resource 108 communicatively coupled to processor 103, and a user interface 110 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, storage resource 108, and/or another component of information handling system 102.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 102 is turned off.

Storage resource 108 may include a system, device, or apparatus configured to store data. Storage resource 108 may include one or more hard disk drives, magnetic tape libraries, optical disk drives, magneto-optical disk drives, solid state storage drives, compact disk drives, compact disk arrays, disk array controllers, and/or any other systems, apparatuses or devices configured to store data. In certain embodiments, storage resource 108 may include one or more storage enclosures configured to hold and/or power one or more of such devices. In the embodiments represented by FIG. 1, storage resource 108 may reside within information handling system 102. However, in other embodiments, storage resource 108 may reside external to information handling system 102 (e.g., may be coupled to information handling system 102 via a network).

User interface 110 may comprise any instrumentality or aggregation of instrumentalities by which a user may interact with information handling system 102. For example, user interface 110 may permit a user to input data and/or instructions into information handling system 102, and/or otherwise manipulate information handling system 102 and its associated components. User interface 110 may also permit information handling system 102 to communicate data to a user, e.g., by way of a display device.

In addition to processor 103, memory 104, storage resource 108, and user interface 110, information handling system 102 may include one or more other information handling resources. Such an information handling resource may include any component system, device or apparatus of an information handling system, including without limitation, a processor, bus, memory, I/O device and/or interface, storage resource (e.g., hard disk drives), network interface, electromechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 2:
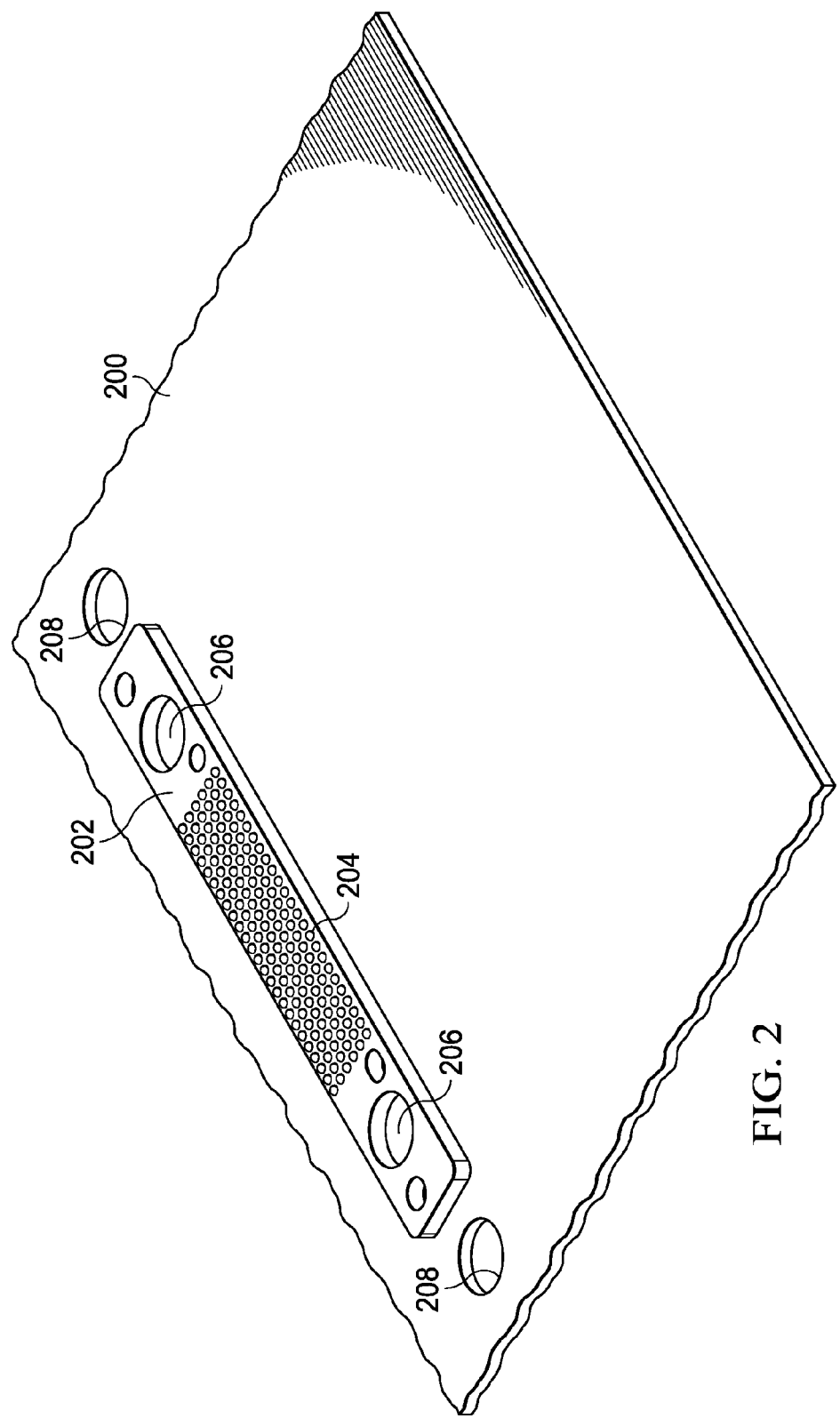
FIG. 2 illustrates a perspective view of an example information handling system component, in accordance with embodiments of the present disclosure.
Figure 3A:
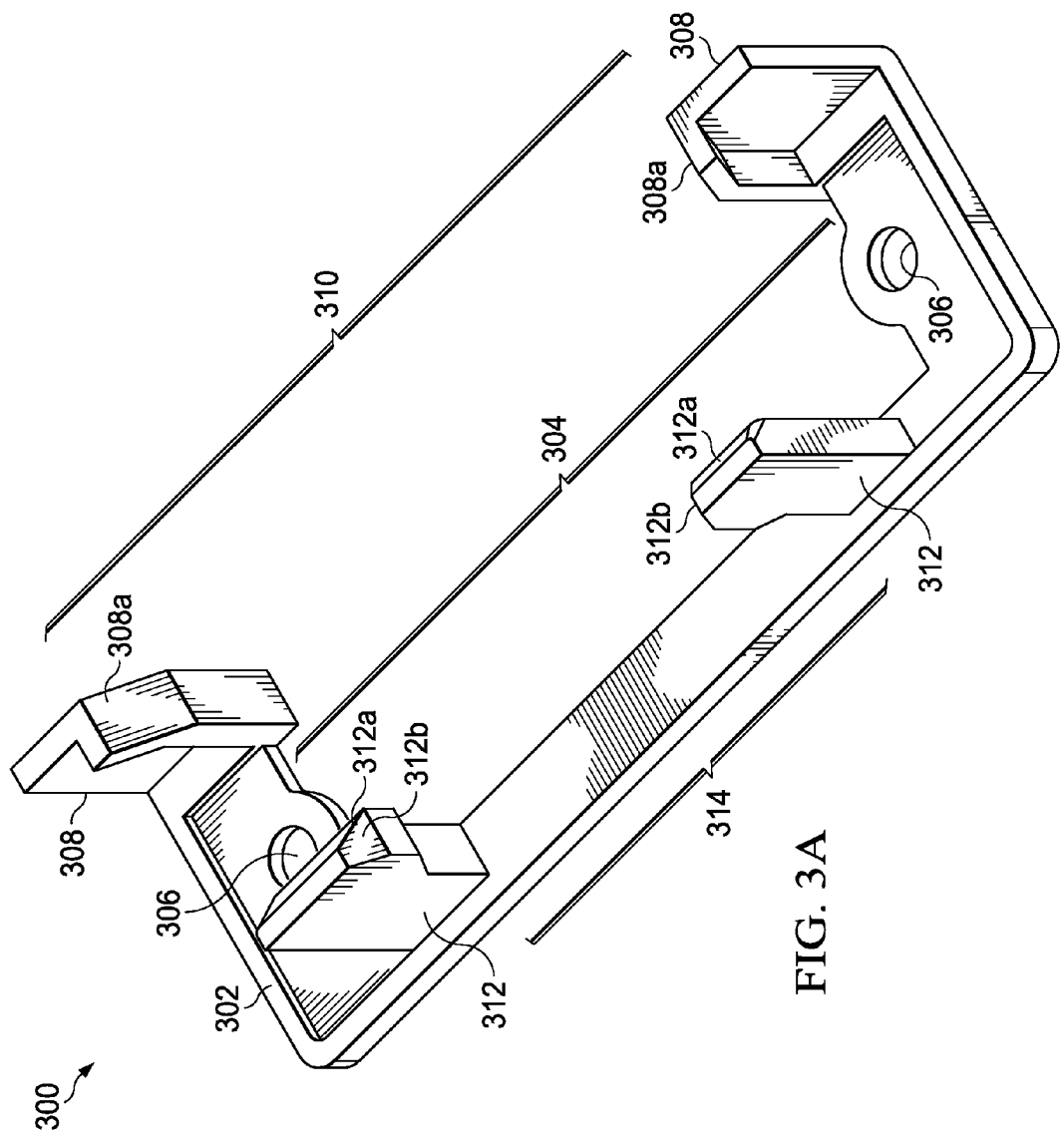
FIG. 3A illustrates a perspective view of an example alignment element, in accordance with embodiments of the present disclosure.
Figure 3B:
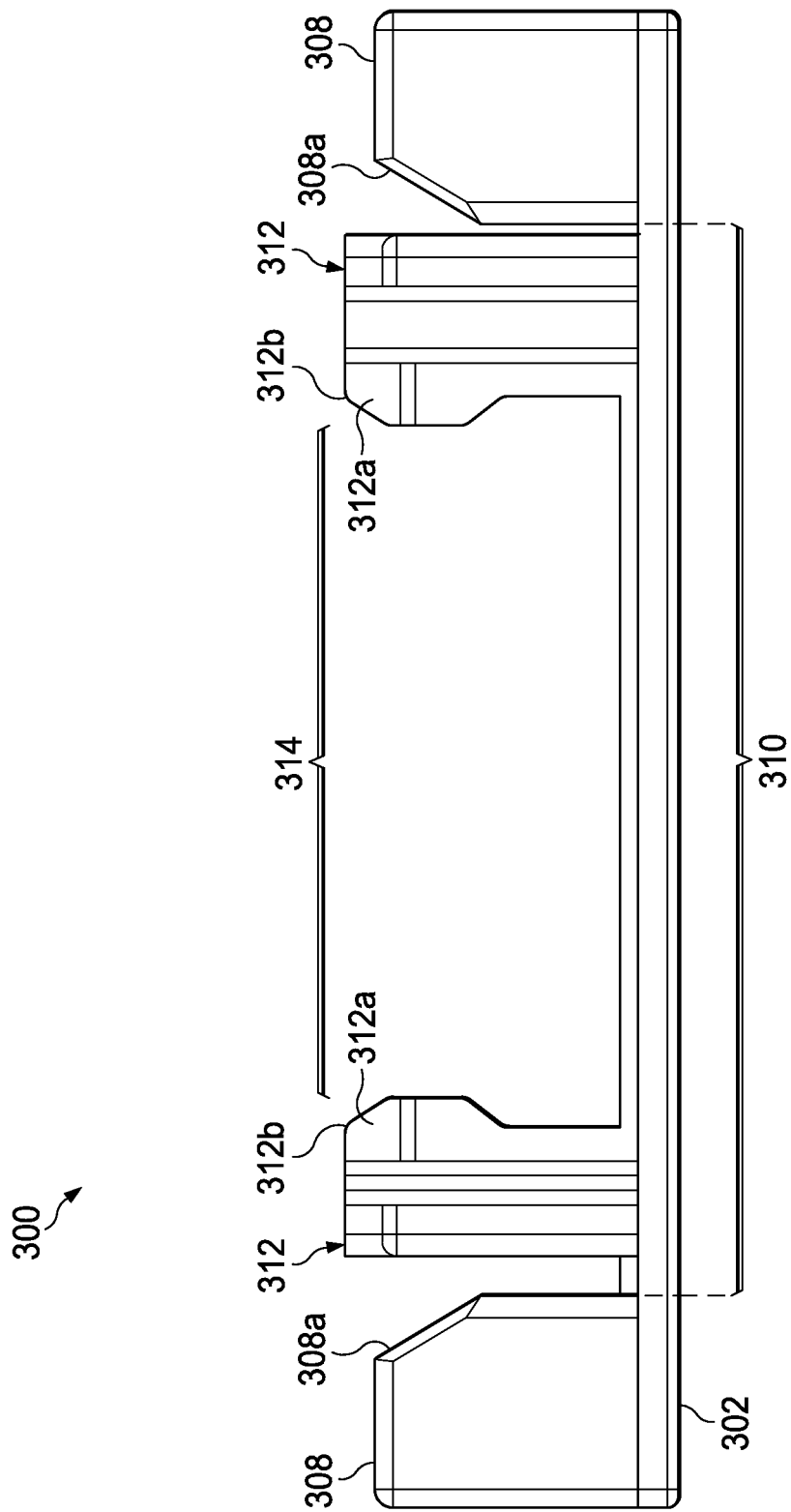
FIG. 3B illustrates an elevation view of the example alignment element of FIG. 3A, in accordance with embodiments of the present disclosure.
Figure 3C:
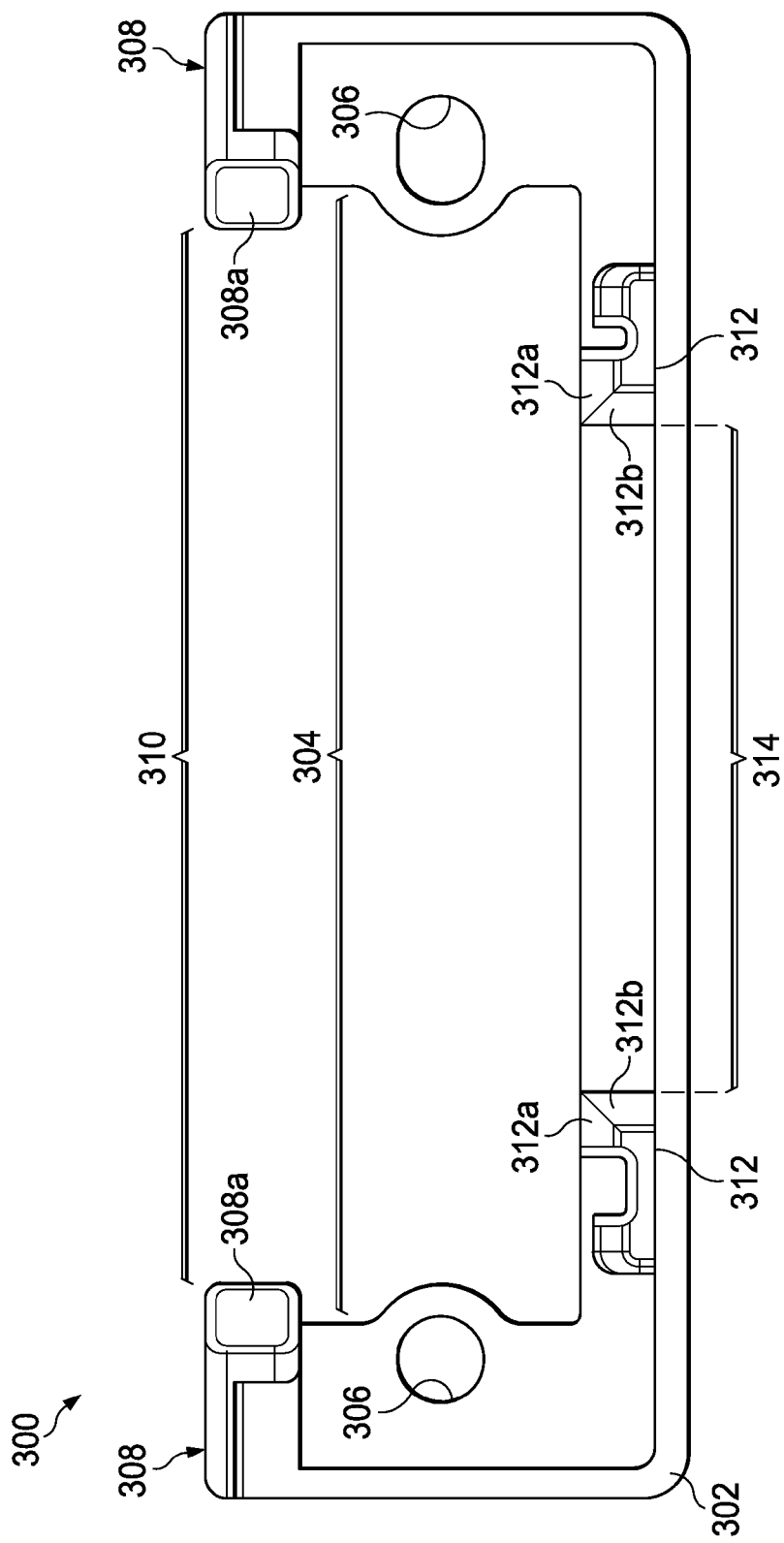
FIG. 3C illustrates a plan view of the example alignment element of FIG. 3A, in accordance with embodiments of the present disclosure.
Figure 3D:
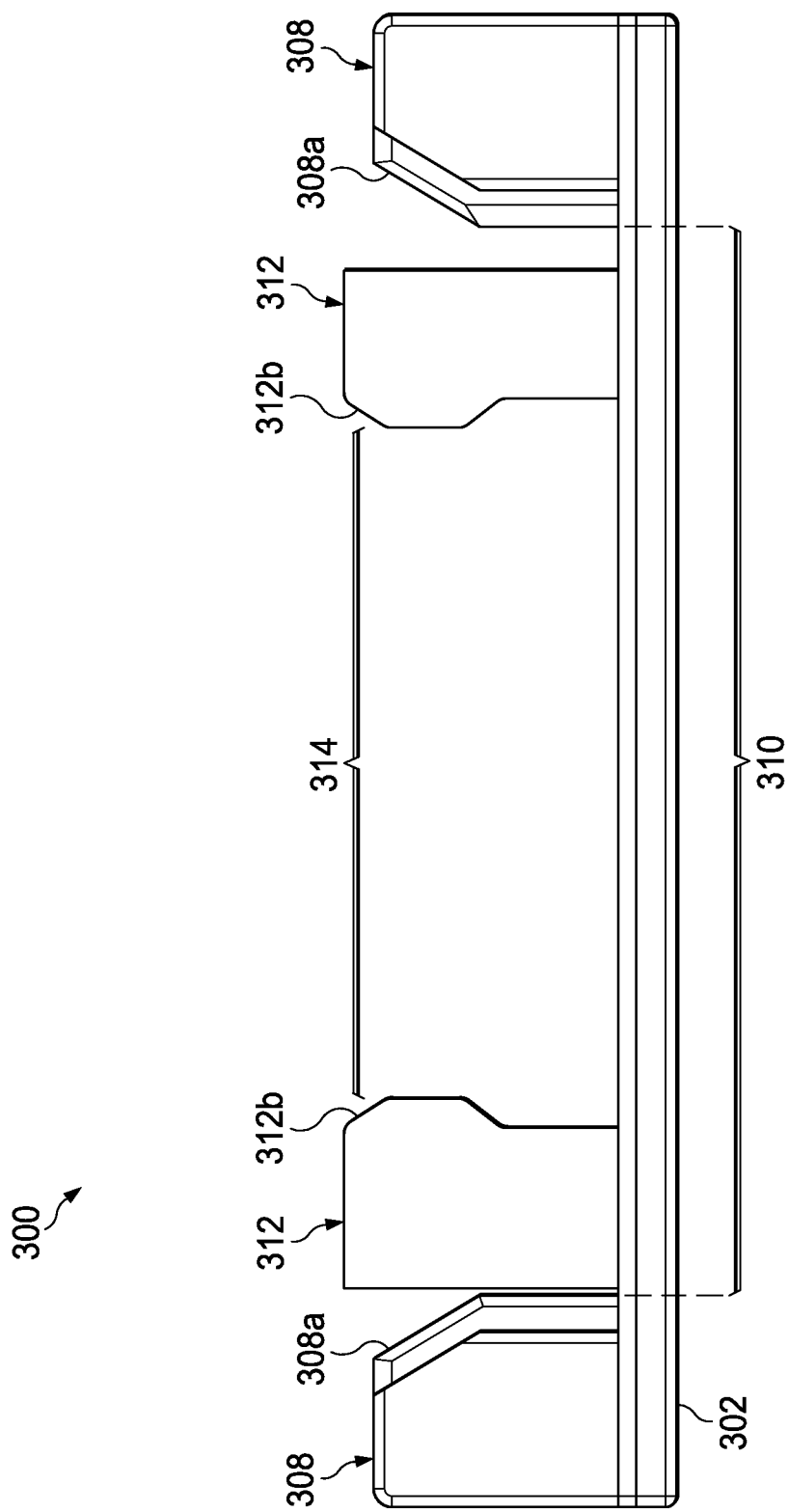
FIG. 3D illustrates an elevation view of the example alignment element of FIG. 3A viewed from a position opposite that of FIG. 3B, in accordance with embodiments of the present disclosure.

FIG. 2 illustrates a perspective view of an example component 200, in accordance with embodiments of the present disclosure. In some embodiments, component 200 may comprise a circuit board such as, for example, a motherboard that may be housed in information handling system 102 discussed above with reference to FIG. 1. As shown in FIG. 1, information handling system 102 may include a board connector 202. In some embodiments, board connector 202 may comprise a connector configured to electrically couple with a compression connector (e.g., connector 404), as discussed in further detail below. While board connector 202 is illustrated as raised from component 200 for clarity of illustration and discussion, board connector 202 may simply include connector pads 204 that may be provided on component 200 and that may be coupled to traces in component 200. As such, board connector 202 may be integral to component 200 rather than including a separate connector that has been attached to component 200. Board connector 202 (and/or component 200) may also define first board retention channels 206 that may be located on opposite sides of connector pads 204 and that may be threaded or include other features for securing to a retention member (e.g., retention member 510,702), discussed in further detail below. Component 200 may also define second board retention channels 208 that may be located on opposite sides of board connector 202 and that may be threaded or include other features for securing to a retention member (e.g., retention member 510,702), discussed in further detail below. In some embodiments, component 200 may couple to a variety of information handling resources known in the art including, for example, processor 103 and system memory 104 discussed above with reference to FIG. 1, and thus board connector 202 (e.g., the connector pads 204) may be coupled to those information handling resources through component 200.

FIGS. 3A-3D illustrate an example alignment element 300, in accordance with embodiments of the present disclosure. Alignment element 300 may include a base member 302 that may define a board connector channel 304. Base member 302 may also define a plurality of board mounting features 306 that may be located on opposite sides of board connector channel 304 and that may be threaded or include other features for securing to a retention member (e.g., retention member 510,702), discussed in further detail below. A plurality of first alignment members 308 may extend from base member 302 on opposite sides of board connector channel 304 and define a first alignment channel 310 between them. Each of the plurality of first alignment members 308 may include a beveled edge 308a that may be located adjacent to first alignment channel 310. A plurality of alignment members 312 may extend from base member 302 in a spaced-apart relationship along an edge of board connector channel 304 and define a alignment channel 314 between them. The plurality of alignment members 312 may provide a first set of beveled edges 312a adjacent to board connector channel 304, and provide a second set of beveled edges 312b adjacent to alignment channel 314.

Figure 4A:
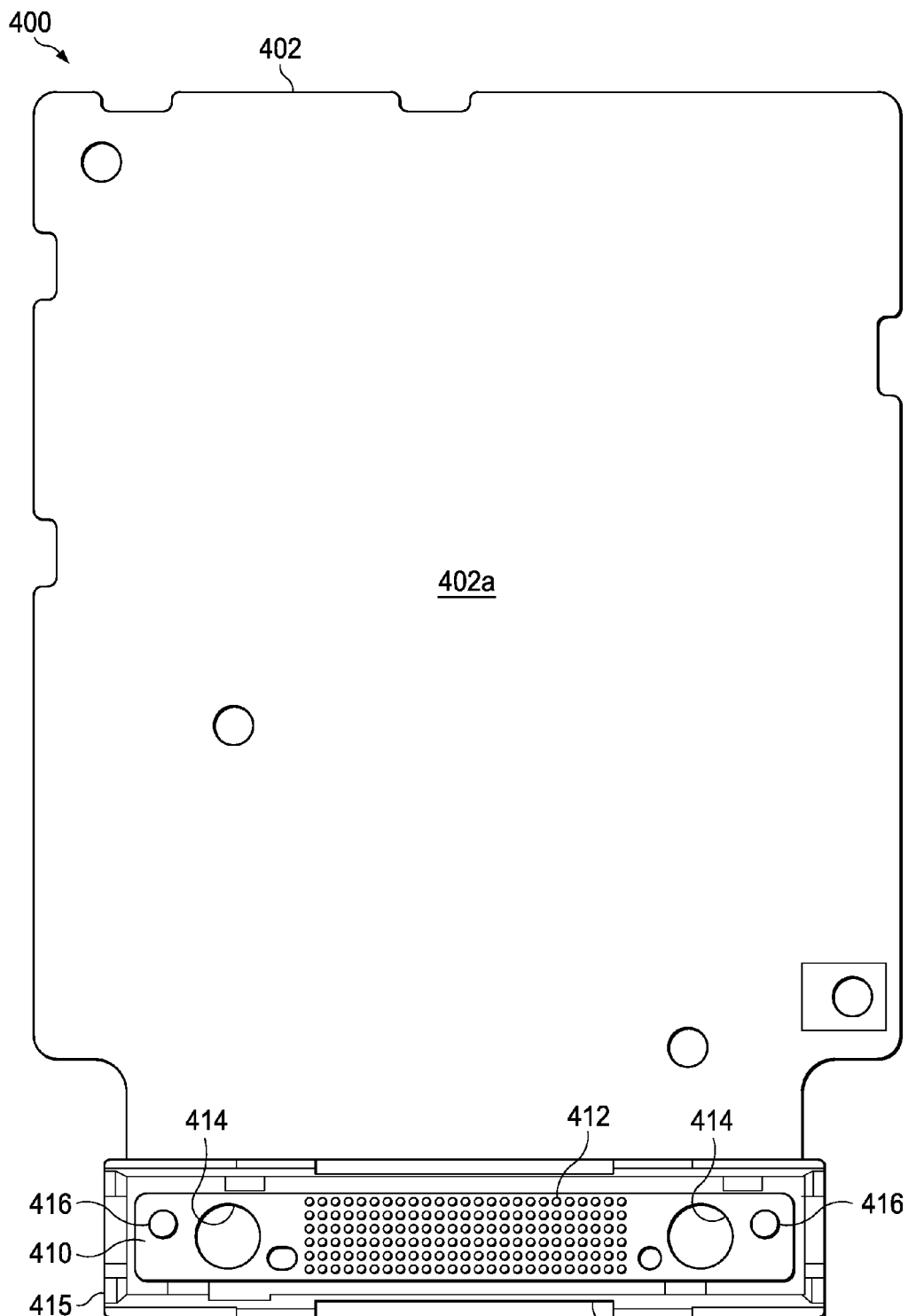
FIG. 4A illustrates a plan view of a first side of another example information handling system component, in accordance with embodiments of the present disclosure.
Figure 4B:
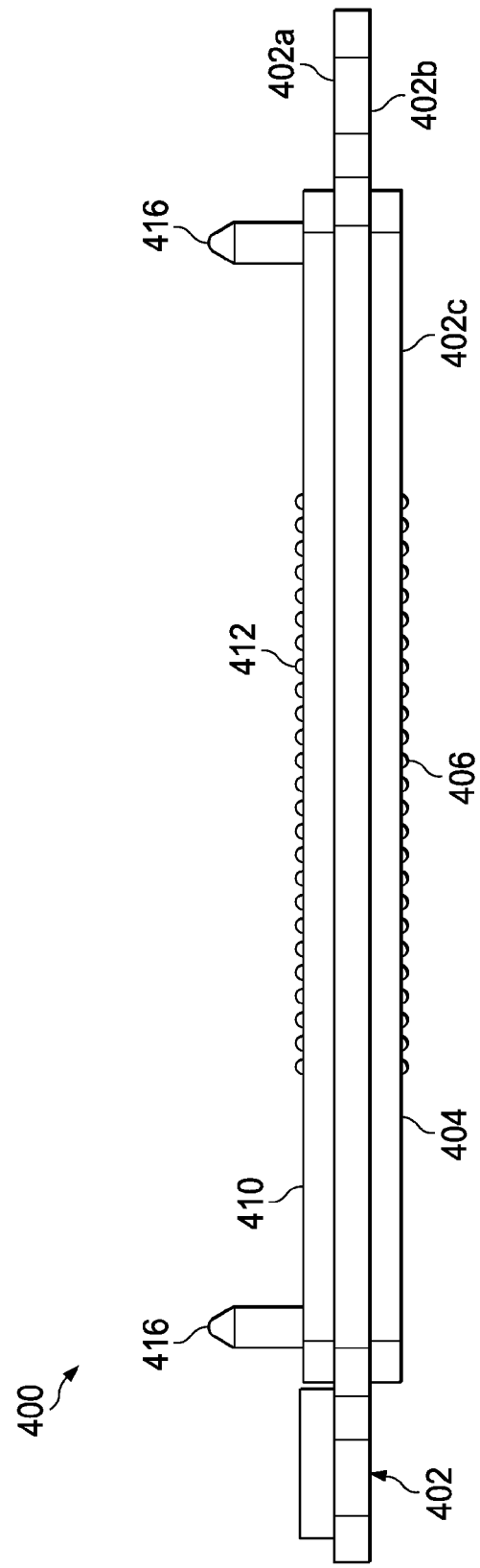
FIG. 4B illustrates an elevation view of the example component of FIG. 4A, in accordance with embodiments of the present disclosure.
Figure 4C:
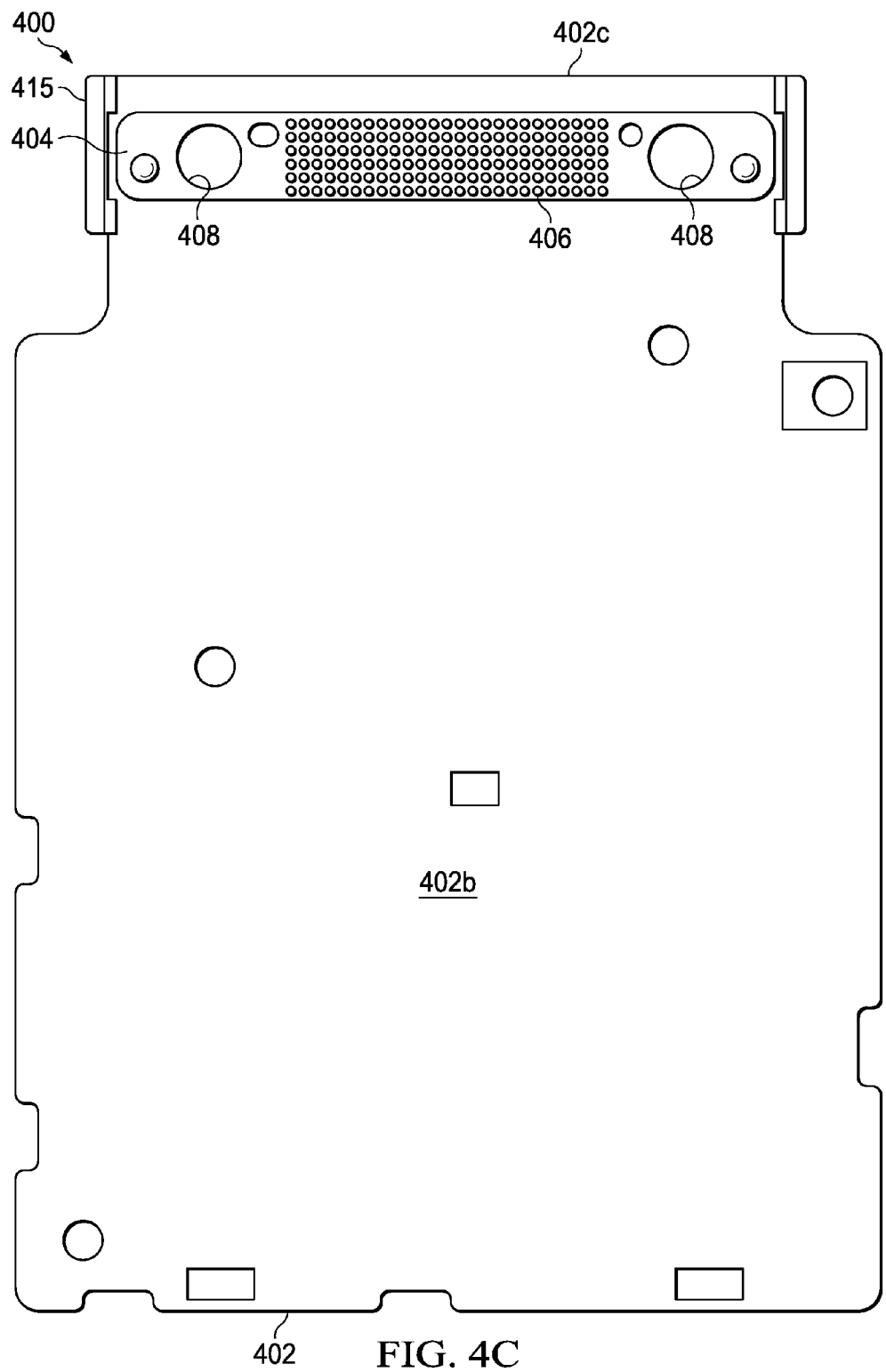
FIG. 4C illustrates a plan view of a second side of the example component of FIG. 4A, in accordance with embodiments of the present disclosure.

FIGS. 4A-4C illustrate an example component 400, in accordance with embodiments of the present disclosure. In the embodiments illustrated and discussed below, component 400 may comprise of an information handling resource card such as, for example, a mezzanine card. For example, component 400 illustrated in FIGS. 4A-4C may compromise a storage mezzanine card such as a Redundant Array of Independent Disks (RAID) mezzanine card. However, one of skill in the art in possession of the present disclosure may recognize that a wide variety of information handling resources may benefit from the teachings of the present disclosure and may fall within its scope. Component 400 may include a card substrate 402 that may be a circuit board including a variety of card components that have not been illustrated for clarity but that may include processing systems, memory systems, storage systems, heat dissipation devices, and/or a variety of other card components known in the art. Card substrate 402 may include a top side 402a, a bottom side 402b that is located opposite card substrate 402 from top side 402a, and a front edge 402c that extends between top side 402a and bottom side 402b. A primary component connector 404 may be located on bottom side 402b of card substrate 402 and adjacent front edge 402c of card substrate 402. In an embodiment, primary component connector 404 may comprise a compression connector. Primary component connector 404 may include a plurality of connector pins 406 and a plurality of primary connector retention channels 408 that may be located on opposite sides of the plurality of connector pins 406.

A secondary component connector 410 may be located on top side 402a of card substrate 402 and adjacent front edge 402c of card substrate 402. In an embodiment, secondary component connector 410 may compromise a compression connector. Secondary component connector 410 may include a plurality of connector pins 412, a plurality of primary connector retention channels 414 that may be located on opposite sides of the plurality of connector pins 412, and a plurality of guide members 416 that extend from primary component connector 410 on opposite sides of the plurality of connector pins 412 and the plurality of primary connector retention channels 414. In some embodiments, a connector protector 415 (omitted in FIG. 4B for clarity) may be coupled to card substrate 402 adjacent front edge 402c, and may extend around and above the plurality of connector pins 412 in order to protect the plurality of connector pins 412 when, for example, component 400 is positioned on a surface. However, in some embodiments, connector protector 415 may be omitted. In some embodiments, card substrate 402 may define substitute retention channels that align with primary connector retention channels 408 and secondary connector retention channels 414 to provide component retention channels that extend through primary component connector 404, card substrate 402, and secondary component connector 410. In some embodiments, primary component connector 404 and secondary component connector 410 may each be coupled through card substrate 402 (e.g., via traces) to a processing system on card substrate 402 that may operate to, for example, convert signals passing between primary component connector 404 and secondary component connector 410 and/or perform a variety of other processing functions known in the art. In some embodiments, primary component connector 404 may be substantially in a direction parallel to front edge 402c directly aligned (e.g., within manufacturing tolerances) with secondary component connector 410 on opposite sides of card substrate 402.

Figure 5A:
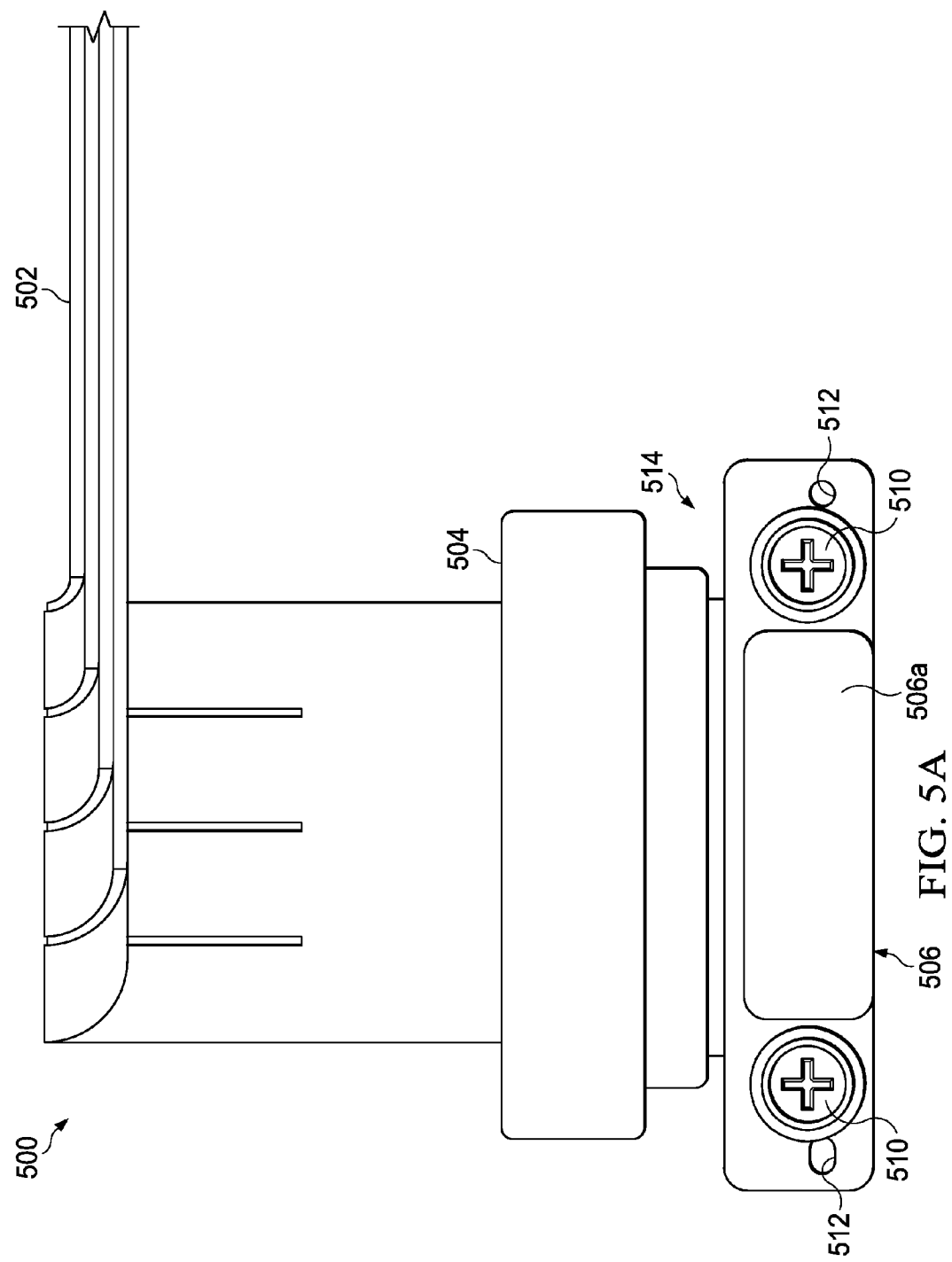
FIG. 5A illustrates a plan view of a first side of yet another example information handling system component, in accordance with embodiments of the present disclosure.
Figure 5B:
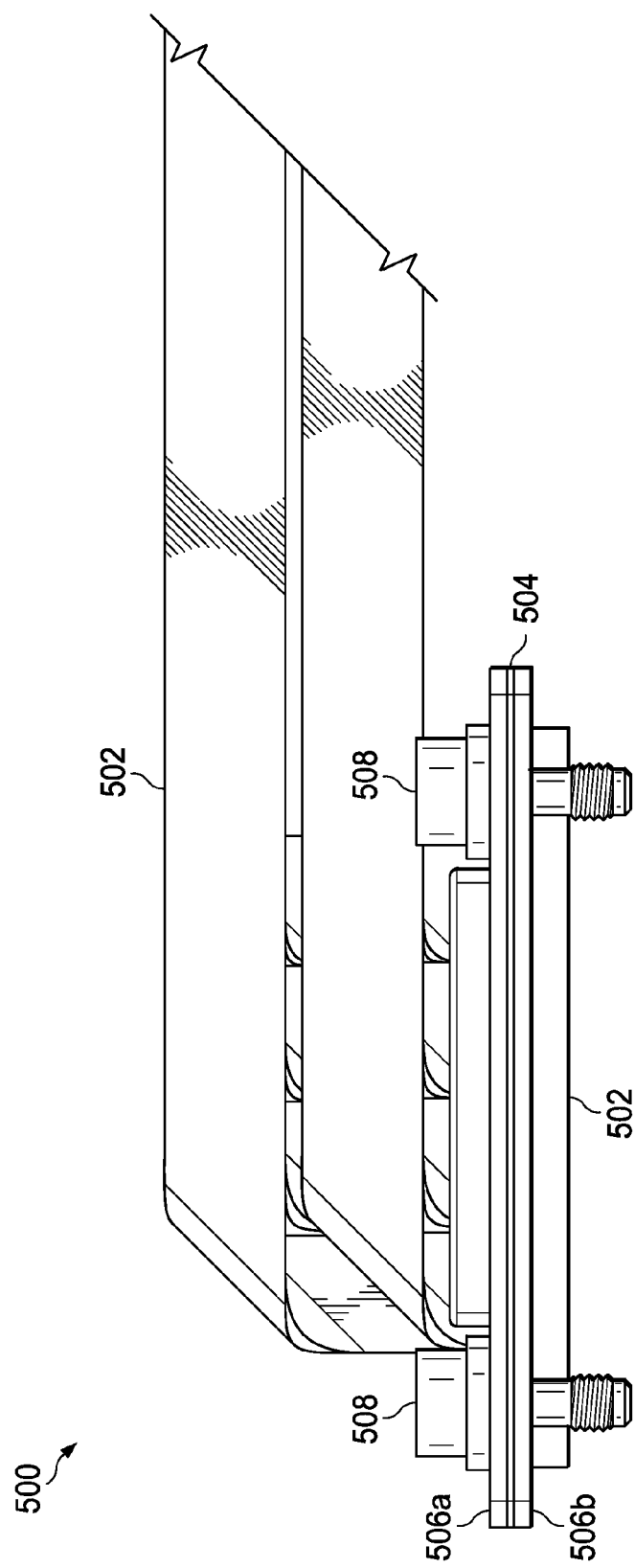
FIG. 5B illustrates an elevation view of the example component of FIG. 5A, in accordance with embodiments of the present disclosure.
Figure 7A:
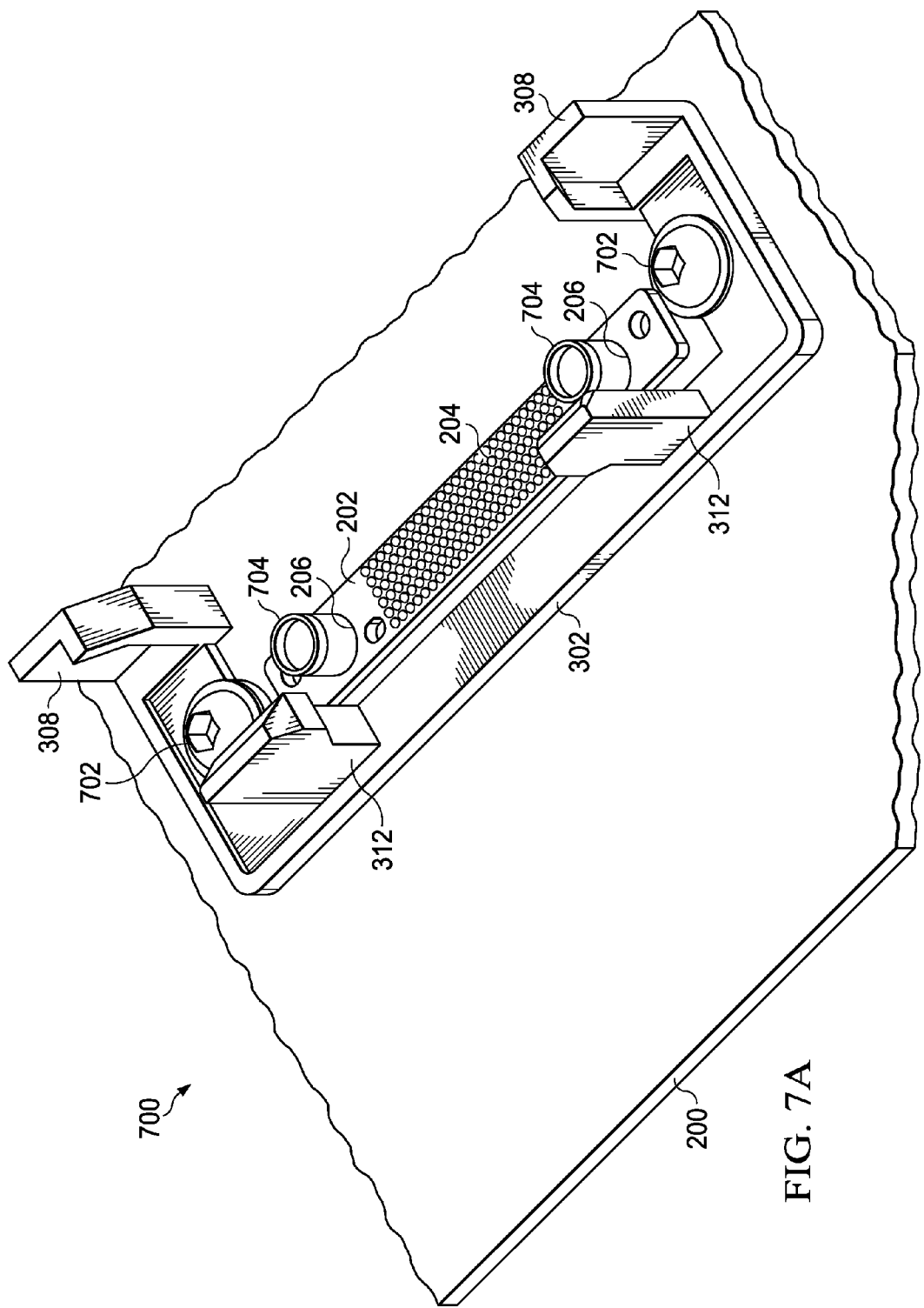
FIG. 7A illustrates a perspective view of the alignment element of FIGS. 3A-3D coupled to the circuit board of FIG. 2, in accordance with embodiments of the present disclosure.
Figure 7B:
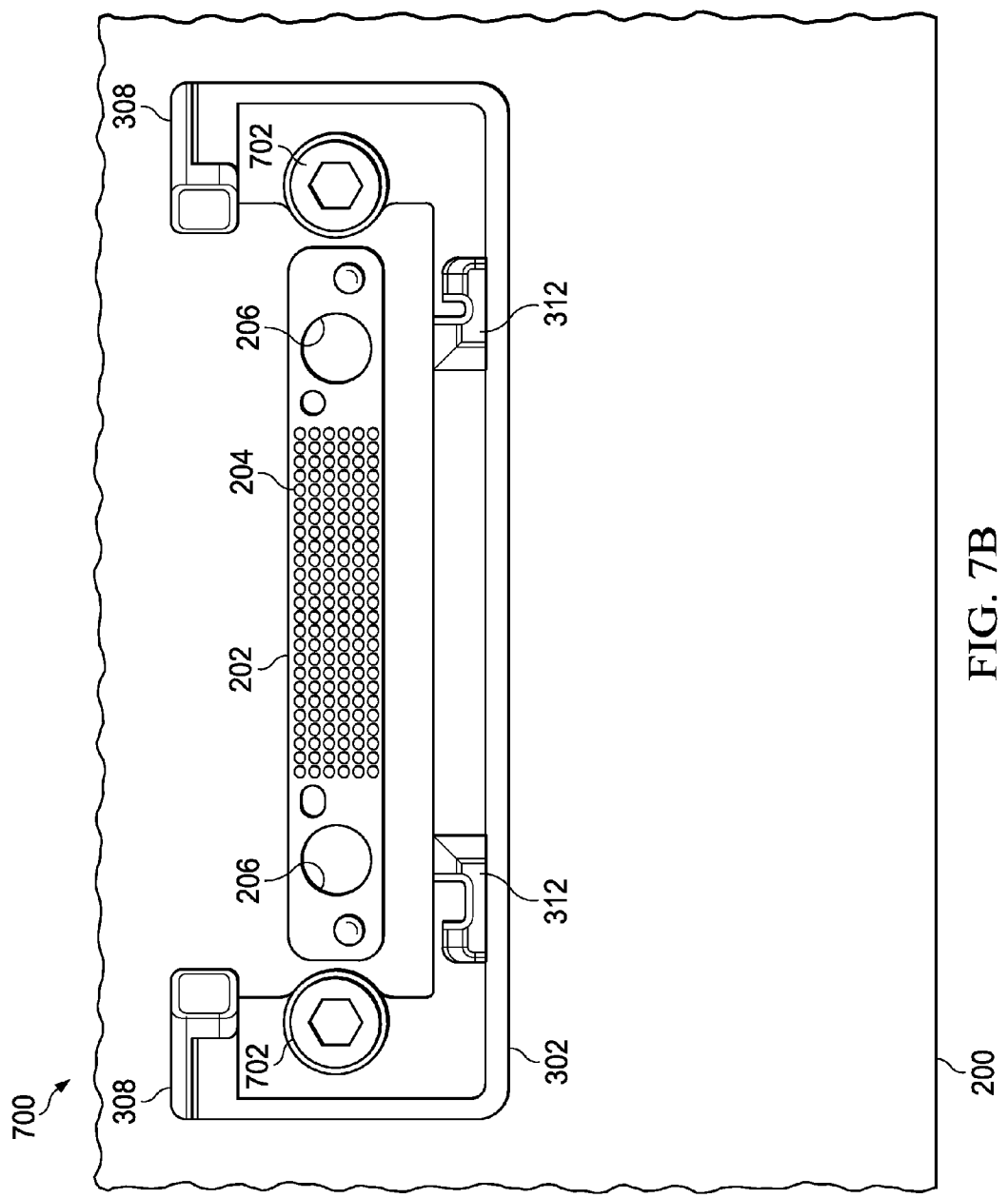
FIG. 7B illustrates a plan view of the alignment element of FIGS. 3A-3D coupled to the circuit board of FIG. 2, in accordance with embodiments of the present disclosure.

FIGS. 5A-5C illustrate an example component 500, in accordance with embodiments of the present disclosure. In the embodiments illustrated and discussed below, component 500 may comprise a cabling system. However, one of skill in the art in possession of the present disclosure may recognize that a wide variety of information handling resources may benefit from the teachings of the present disclosure and may fall within its scope. Component 500 may include cabling 502 that may extend from a cabling base 504. A connector 506 may extend from cabling base 504 opposite cabling base 504 from cabling 502. Connector 506 may include a top side 506a and a bottom side 506b that is located opposite connector 506 from top side 506a. A plurality of connector pads 508 may be located on bottom side 506b of connector 506. A plurality of retention members 510 may be coupled to connector 506 such that each retention member 510 may extend from both top side 506a and bottom side 506b of connector 506. Connector 506 may define a plurality of guide channels 512 that may be located on opposite sides of the plurality of connector pads 508 and the plurality of retention members 510. A plurality of alignment channels 514 may be defined by cabling base 504 and connector 506 and may be located opposite the plurality of connector pads 508 from each other.

Figure 6:
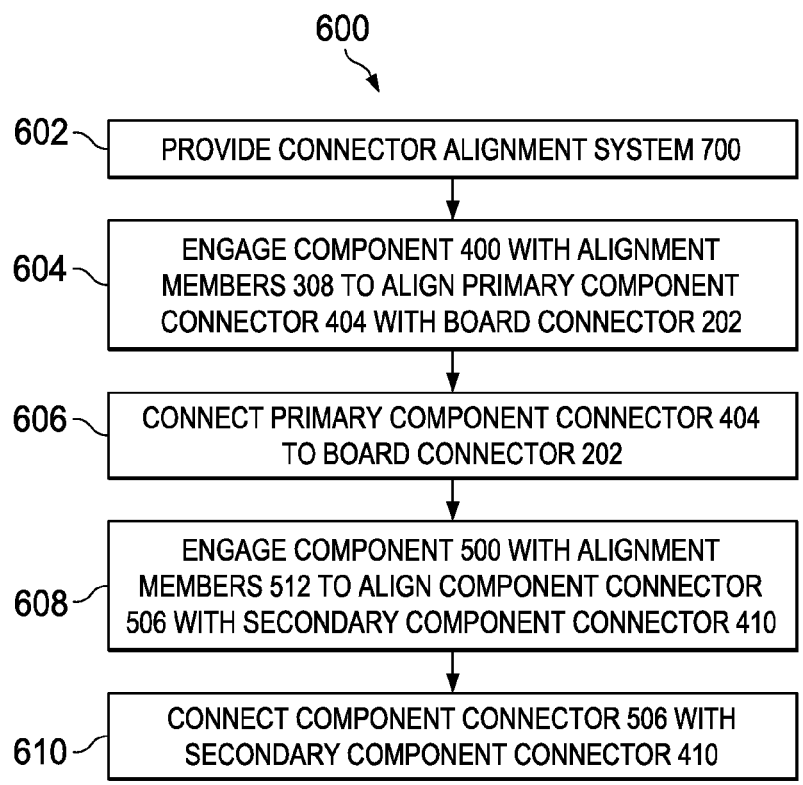
FIG. 6 illustrates a flow chart of an example method for aligning connectors, in accordance with embodiments of the present disclosure.

FIG. 6 illustrates a flow chart of an example method 600 for aligning and retaining connectors 202, 404, 410 and 506, in accordance with embodiments of the present disclosure. Method 600 may also be understood by reference to FIGS. 2, 3A-3D, 6, 7A, 7B, 8, and 9. According to one or more embodiments, method 600 may begin at step 602. As noted above, teachings of the present disclosure may be implemented in a variety of configurations. As such, the preferred initialization point for method 600 and the order of the steps comprising method 600 may depend on the implementation chosen.

At step 602, a connector alignment system 700 may be provided. In some embodiments of step 602, alignment element 300 discussed above with reference to FIGS. 3A-3D may be mounted to component 200 discussed above with reference to FIG. 2 to provide connector alignment system 700 illustrated in FIGS. 7A and 7B. To mount alignment element 300 to component 200, alignment element 300 may be positioned adjacent component 200 such that board mounting features 306 defined by base member 302 may be aligned with second board retention channels 208 defined by component 200, and board connector 202 on component 200 may be located adjacent board connector channel 304 defined by base member 302. Retention members 702 (e.g., screws in the illustrated embodiment) may then be positioned through board mounting features 306 defined by base member 302 and engaged with second board retention channels 208 defined by component 200 in order to secure alignment element 300 to component 200 such that board connector 202 may be located immediately adjacent and/or extending into board connector channel 304. The orientation of alignment element 300 relative to component 200 may be selected by the user based on the desired orientations of component 400 and/or component 500. In the embodiments represented by FIG. 7A, guide features/retention members 704 may be positioned in first board retention channels 206 on component 200. However, in some embodiments, guide features/retention members 704 may be omitted from connector alignment system 700.

Figure 8:
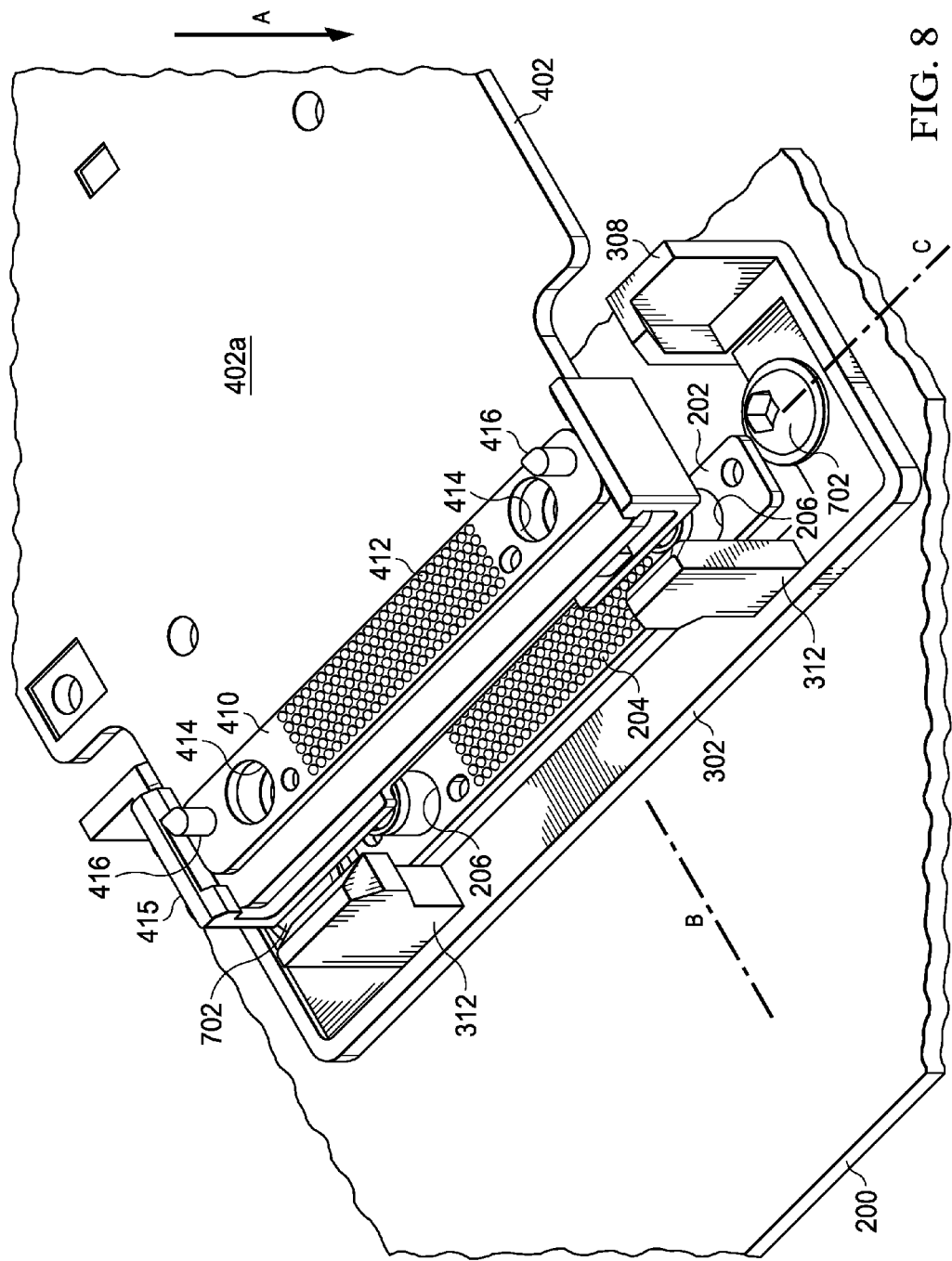
FIG. 8 illustrates a perspective view of the information handling resource card of FIGS. 4A-4C being coupled to the circuit board of FIG. 2 using the alignment element of FIGS. 3A-3D, in accordance with embodiments of the present disclosure.

At step 604, a second component 400 may be engaged with first alignment members 308 to align a primary component connector 404 with a board connector 202. In some embodiments, with connector alignment system 700 provided as discussed above with reference to step 602, component 400 discussed above with reference to FIGS. 4A-4C may be positioned adjacent alignment element 300 such that bottom side 402b of card substrate 402 faces component 200 and primary component connector 404 is located adjacent board connector 202, as illustrated in FIG. 8. Component 400 may then be moved in a direction A relative to and towards component 200. In response to movement of component 400 in the direction A, one or more edges of component 200 adjacent front edge 402c may engage one or more of first alignment members 308 on alignment element 300 to enter first alignment channel 310. In a specific example, the one or more edges of component 200 adjacent front edge 402c may engage beveled edges 308a on the one or more first alignment members 308 in response to the movement in direction A, which channels component 400 into first alignment channel 304 such that primary component connector 404 may be aligned with board connector 202 along a first axis B. In addition, also in response to movement of component 400 in the direction A, connector protector 415 (or front edge 402c of card substrate 402 when no connector protector 415 is provided) may engage one or more of alignment members 312 on alignment element 300. In a specific example, connector protector 415 (or front edge 402c of card substrate 402) may engage first set of beveled edges 312a on one or more alignment members 312 in response to the movement in direction A, which operates to align primary component connector 404 with board connector 202 along a second axis C. In some embodiments, first alignment members 308 and/or alignment members 312 may include detents (e.g., below beveled edges 308a on first alignment members 308, and below first set of beveled edges 312a on alignment members 312) that may operate to hold component 400 in an aligned position engaging alignment element 300 after moving a sufficient distance in the direction A.

Accordingly, at step 604, the positioning of component 400 adjacent alignment element 300 and movement in the direction A, as discussed above, may operate to align primary component connector 404 with board connector 202 along two axes (e.g., the first axis B and the second axis C in the illustrated embodiment). Alignment of primary component connector 404 and board connector 202 along these two axes may operate to align connector pins 406 on primary component connector 404 with connector pads 204 on board connector 202, as well as to align the first component retention channels on component 400 with first board retention channels 206 (and in some embodiment, guide features/retention members 704) on board connector 202.

At step 606, primary component connector 404 may be coupled to board connector 202. Continued movement of component 400 in the direction A may cause primary component connector 404 to engage board connector 202, with first alignment members 308/first alignment channel 310 and alignment members 312 ensuring that connector pins 406 on primary component connector 404 are properly aligned with connector pads 204 on board connector 202 for mating, engagement, and/or otherwise being electrically coupled. In addition, in some embodiments the continued movement of component 400 in direction A may cause guide features/retention members 704 to enter the component retention channels on component 400 to further ensure proper alignment of connector pins 406 and connector pads 204. However, one of skill in the art in possession of the present disclosure may recognize that alignment element 300 may negate the need for guide features/retention members 704 to perform the alignment process. Thus, connector alignment system 700 may operate to ensure alignment of connector pins 406 and connector pads 204 on primary component connector 404 and board connector 202, respectively, in order to prevent possible damage that may occur in response to an attempt to couple them in an unaligned state. In some embodiments, a latch may be included on alignment element 300 and may be configured to extend across alignment element 300 and into engagement with component 400 in order to provide a load on component 400 that ensures electrical coupling between primary component connector 404 and board connector 202.

Figure 9:
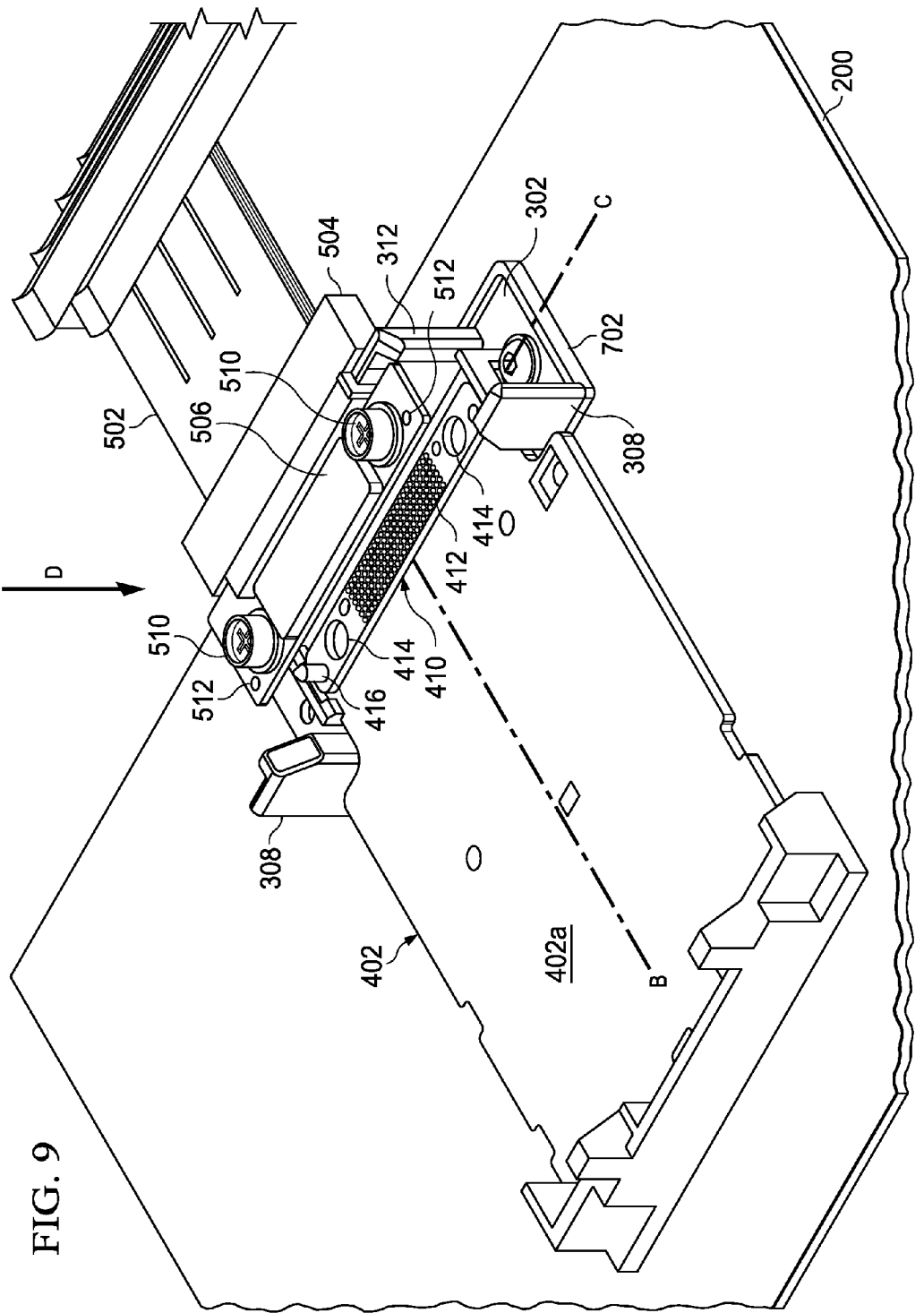
FIG. 9 illustrates a perspective view of the cabling system of FIGS. 5A and 5B being coupled to the information handling resource card of FIGS. 4A-4C and the circuit board of FIG. 2 using the alignment element of FIGS. 3A-3D, in accordance with embodiments of the present disclosure.

At step 608, a second component 500 may be engaged with alignment members 512 to align a connector 506 with secondary component connector 410. In some embodiments, with primary component connector 404 mated with, engaging, and/or otherwise prepared for electrical coupling with board connector 202, as discussed above with reference to steps 604 and 606, component 500 discussed above with reference to FIGS. 5A-5C may be positioned adjacent alignment element 300 such that bottom side 506b of connector 506 faces component 200 and is located adjacent secondary component connector 410 on component 400, and guide components 416 on component 400 may be aligned with alignment members 512, as illustrated in FIG. 9. Component 500 may then be moved in a direction D relative to and towards component 200. In response to movement of component 500 in the direction D, alignment members 312 on alignment element 300 may enter second component alignment channels 514 on component 500, second component connector 506 may engage one or more of alignment members 312, and component 500 may enter the alignment channel 314. In a specific example, portions of cabling base 504 and connector 506 that define second component alignment channels 514 may engage the second set of beveled edges 312a on the one or more alignment members 312 in response to the movement in direction D, which may channel component 500 into alignment channel 314 such that second component connector 506 is aligned with secondary component connector 410 along first axis B. In addition, also in response to movement of component 500 in the direction D, portions of cabling base 504 and connector 506 that define second component alignment channels 514 may engage second set of beveled edges 312b on the one or more alignment members 312 in response to the movement in direction D, which may operate to align connector 506 with secondary component connector 410 along the second axis C. In some embodiments, alignment members 312 may include detents (e.g., below the first set of beveled edges 312a and/or the second set of beveled edges 312b on alignment members 312) that may operate to hold component 500 in an aligned position engaging alignment element 300 after moving a sufficient distance in the direction D.

Thus, at step 608, the positioning of component 500 adjacent alignment element 300 and movement in the direction D, as discussed above, may operate to align connector 506 with secondary component connector 410 along two axes (e.g., the first axis B and the second axis C in the illustrated embodiment). Alignment of connector 506 and secondary component connector 410 along these two axes may operate to align connector pads 508 on connector 506 with connector pins 412 on secondary component connector 410, to align first component retention channels on component 400 with retention members 510 on connector 506, and to align guide members 416 on secondary component connector 410 with guide channels 512 on connector 506.

As step 610, component connector 506 may be coupled to secondary component connector 410. Continued movement of component 500 in the direction D may cause connector 506 to engage secondary component connector 410, with alignment members 312/alignment channel 314 ensuring that connector pins 412 on secondary component connector 410 are properly aligned with connector pads 508 on connector 506 for mating, engagement, and/or otherwise being electrically coupled. In addition, in some embodiments, the continued movement of component 500 in the direction D may cause guide members 416 to enter guide channels 512 on connector 506 to further ensure proper alignment of connector pins 412 and connector pads 508. However, in some embodiments, guide members 416 may be omitted, and only alignment element 300 may operate to align connector 506 and secondary component connector 410. Thus, connector alignment system 700 may operate to ensure alignment of connector pins 412 and connector pads 508 on connector 506 and secondary component connector 410, respectively, in order to prevent possible damage that may occur in response to an attempt to couple them in an unaligned state. Upon engaging connector 506 and secondary component connector 410, retention members 510 may extend through first component retention channels defined by component 400, and may be engaged with board retention channels 206 to secure both component 400 and component 500 to component 200 and to ensure mating, engagement, and/or electrical coupling of primary component connector 404 with board connector 202 and of secondary component connector 410 with connector 506. In some embodiments, a latch may be included on alignment element 300 and configured to extend across alignment element 300 and into engagement with component 500 in order to provide a load on component 500 that ensures an electrical coupling between connector 506 and secondary component connector 410 and/or primary component connector 404 and board connector 202.

Although FIG. 6 discloses a particular number of steps to be taken with respect to method 600, method 600 may be executed with greater or fewer steps than those depicted in FIG. 6. In addition, although FIG. 6 discloses a certain order of steps to be taken with respect to method 300, the steps comprising method 600 may be completed in any suitable order.

Systems and methods have been described herein that provide a stacked compression connector system that allows an information handling resource card to include two stacked compression connectors on opposite sides of the information handling resource card which maintain the same footprint. Also, the systems and methods herein provide a stacked compression connector system in which retention hardware for the stacked compression connector system is not present on the information handling resource card, thus freeing up more density for signal routing and/or other features on an information handling resource card as compared to traditional approaches. In addition or alternatively, the stacked compression connector system disclosed herein may be capable of handling the high mating force generally associated with high speed connections.

Figure 10:
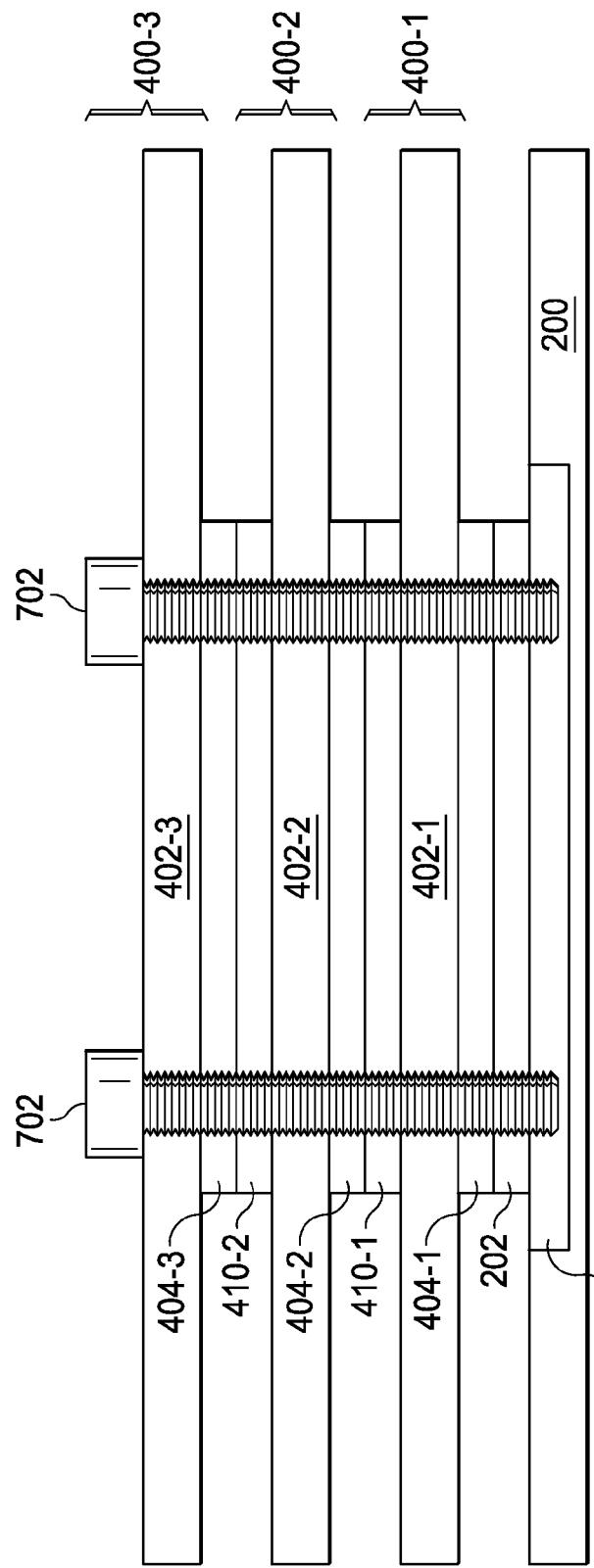
FIG. 10 illustrates an elevation view of an example system having multiple information handling resource cards stacked and coupled to one another using the systems and methods disclosed herein, in accordance with embodiments of the present disclosure.

While the embodiments illustrated and described above includes only three stacked components 200, 400, and 500, additional components with similar compression connectors may be provided, aligned, and coupled in substantially the same manner using alignment element 300 (or similar alignment elements) while remaining within the scope of the present disclosure. For example, as shown in FIG. 10, in addition to a component 400-1 with compression connectors 404-1 and 410-1 aligned with and coupled to connector 202 of component 200 and alignment element 300, a third component 400-2 with compression connectors 404-2 and 410-2 may be aligned with and coupled to connector 404-1 of component 400-1 and alignment element 300, a fourth component 400-3 with compression connector 410-3 may be aligned with and coupled to connector 404-3 of third component 400-2 and alignment element 300, and so on, such that retention members 510 mate and secure all of such compression connectors of components 200, 400-1, 400-2, and 403-3.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A circuit board comprising:
   a substrate having a first side and a second side and having formed therein a substrate retention channel;
   a primary compression connector coupled to the first side having formed thereon a primary connector retention channel aligned with the substrate retention channel; and
   a second compression connector coupled to the second side opposite from the first compression connector and having formed thereon a secondary connector retention channel aligned with the substrate retention channel and the primary connector retention channel to define a circuit board retention channel.

2. The circuit board of claim 1, wherein the primary compression connector and second compression connector are substantially directly aligned in a direction perpendicular to the first side.

3. The circuit board of claim 1, wherein:
   the primary compression connector is configured to couple to a corresponding primary connector of a first component other than the circuit board, the first component having a first component retention channel;
   the second compression connector is configured to couple to a corresponding secondary connector of a second component other than the circuit board and the first component, the second component having a second component retention channel; and
   the circuit board retention channel, the first component retention channel, and the second component retention channel are configured to align and receive a retention element to:
      mechanically couple the circuit board, the first component, and the second component to one another;
      electrically couple the primary compression connector to the corresponding primary connector; and
      electrically couple the second compression connector to the corresponding secondary connector.

4. The circuit board of claim 3, wherein at least one of the first component and the second component comprises a second circuit board.

5. The circuit board of claim 3, wherein at least one of the first component and the second component comprises a cabling system.

6. A system comprising:
a first component having a first component connector and a first component retention channel;
a second component comprising:
a substrate having a first side and a second side and having formed therein a substrate retention channel;
a primary compression connector coupled to the first side having formed thereon a primary connector retention channel aligned with the substrate retention channel; and
a second compression connector coupled to the second side opposite from the first compression connector and having formed thereon a secondary connector retention channel aligned with the substrate retention channel and the primary connector retention channel to define a second component retention channel aligned with the first component retention channel;
a third component having a third component connector and a third component retention channel aligned with the first component retention channel and the second component retention channel; and
a retention element configured to be received in the first component retention channel, the second component retention channel, and the third component retention channel, and further configured to:
mechanically couple the first component, the second component, and the third component to one another;
electrically couple the primary compression connector to the first component connector; and
electrically couple the second compression connector to the third component connector.

7. The system of claim 6, wherein the primary compression connector and second compression connector are substantially directly aligned in a direction perpendicular to the first side.

8. The system of claim 6, wherein at least one of the first component, the second component, and the third component comprises a circuit board.

9. The system of claim 6, wherein at least one of the first component and the third component comprises a cabling system.

10. A method for coupling information handling resources, comprising:
providing a first component having a first component connector and a first component retention channel;
providing a second component comprising:
a substrate having a first side and a second side and having formed therein a substrate retention channel;
a primary compression connector coupled to the first side having formed thereon a primary connector retention channel aligned with the substrate retention channel; and
a second compression connector coupled to the second side opposite from the first compression connector and having formed thereon a secondary connector retention channel aligned with the substrate retention channel and the primary connector retention channel to define a second component retention channel aligned with the first component retention channel;
providing a third component having a third component connector and a third component retention channel aligned with the first component retention channel and the second component retention channel;
coupling a retention element within the first component retention channel, the second component retention channel, and the third component retention channel configured to:
mechanically couple the first component, the second component, and the third component to one another;
electrically couple the primary compression connector to the first component connector; and
electrically couple the second compression connector to the third component connector.

11. The method of claim 10, wherein the primary compression connector and second compression connector are substantially directly aligned in a direction perpendicular to the first side.

12. The method of claim 10, wherein at least one of the first component, the second component, and the third component comprises a circuit board.

13. The method of claim 10, wherein at least one of the first component and the third component comprises a cabling system.

* * * * *